US009577130B2

(12) United States Patent
Eickelmann et al.

(10) Patent No.: US 9,577,130 B2
(45) Date of Patent: Feb. 21, 2017

(54) THIN FILM SOLAR CELL BACKSIDE CONTACT (71) Applicant: International Business Machines Corporation, Armonk, NY (US)

(72) Inventors: Hans-Juergen Eickelmann, Mainz (DE); Ruediger Kellmann, Mainz (DE); Hartmut Kuehl, Mainz (DE); Markus Schmidt, Mainz (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/249,798

(22) Filed: Aug. 29, 2016

(65) Prior Publication Data

US 2016/0372617 A1    Dec. 22, 2016

Related U.S. Application Data (62) Division of application No. 14/746,413, filed on Jun. 22, 2015.

(51) Int. Cl.
*H01L 31/0445* (2014.01)
*H01L 31/0216* (2014.01)
*H01L 31/054* (2014.01)
*H01L 31/032* (2006.01)
*H01L 31/02* (2006.01)

(52) U.S. Cl.
CPC ..... *H01L 31/0445* (2014.12); *H01L 31/02008* (2013.01); *H01L 31/02168* (2013.01); *H01L 31/0322* (2013.01); *H01L 31/0326* (2013.01); *H01L 31/0547* (2014.12)

(58) Field of Classification Search
CPC ............... H01L 31/022441; H01L 31/0445; H01L 31/02167; H01L 31/02168; H01L 31/02327; H01L 31/0322; H01L 31/0326; H01L 31/18
See application file for complete search history.

(56) References Cited

U.S. PATENT DOCUMENTS

| 4,078,945 A | 3/1978 | Gonsiorawski |
| 5,759,292 A | 6/1998 | Arimoto et al. |
| 2007/0210299 A1 | 9/2007 | Hirose et al. |

(Continued)

FOREIGN PATENT DOCUMENTS

TW    201424015 A    6/2014

OTHER PUBLICATIONS

Vermang et al., Improved Rear Surface Passivation of CU(IN,Ga)Se2 Solar Cells: A Combination of Al2O3 Rear Surface Passivation Layer and Nanosized Local Rear Point Contacts, IEEE Journal of Photovoltaics, vol. 4, No. 1, Jan. 2014, pp. 486-492.

(Continued)

*Primary Examiner* — Scott B Geyer
(74) *Attorney, Agent, or Firm* — Lieberman & Brandsdorfer, LLC (57) ABSTRACT

Embodiments relate to a thin film solar cell backside contact. A planar substrate is provided and an associated backside of the substrate is modified to form one or more pedestals. The modified substrate is layered with multiple layers of material, including a conducting layer, a reflective layer, and a passivation layer. The layered backside substrate is polished to expose portions of the conducting layer at discrete locations on the backside of the substrate. The exposed portions of the conducting layer maintain direct electrical communication between an absorber layer deposited on the layered backside substrate and the conducting layer.

6 Claims, 7 Drawing Sheets (56) References Cited

U.S. PATENT DOCUMENTS

| | | |
|---|---|---|
| 2008/0251120 A1 | 10/2008 | Malmstrom et al. |
| 2009/0194150 A1 | 8/2009 | Aoki |
| 2010/0080914 A1 | 4/2010 | Forrest et al. |
| 2011/0100457 A1 | 5/2011 | Kim et al. |
| 2012/0012166 A1 | 1/2012 | Atanackovic |
| 2012/0080092 A1 | 4/2012 | Singh et al. |
| 2012/0318340 A1 | 12/2012 | Heng et al. |
| 2013/0167915 A1 | 7/2013 | Moslehi et al. |
| 2013/0288424 A1 | 10/2013 | Parikh et al. |
| 2013/0298976 A1 | 11/2013 | Chang et al. |
| 2014/0069496 A1 | 3/2014 | Biswas et al. |
| 2014/0080250 A1 | 3/2014 | Liang et al. |
| 2014/0102509 A1 | 4/2014 | Eickelmann et al. |
| 2014/0261666 A1 | 9/2014 | Stewart et al. |
| 2015/0187965 A1 | 7/2015 | Stockum et al. |

OTHER PUBLICATIONS

List of IBM Patents or Applications Treated as Related, Aug. 2016.

THIN FILM SOLAR CELL BACKSIDE CONTACT

CROSS-REFERENCE TO RELATED APPLICATION(S)

This application is a divisional of U.S. patent application Ser. No. 14/746,413, filed on Jun. 22, 2015 and titled "Thin Film Solar Cell Backside Contact Manufacturing Process," now pending, which is hereby incorporated by reference.

BACKGROUND

The present embodiments relate to a thin film solar cell. More specifically, the embodiments relate to a thin film solar cell backside contact.

A solar cell is a solid state electrical device that converts light energy into electrical energy by a photovoltaic effect. In order to lower the cost of electricity below the costs of electricity from fossil sources, it is necessary to improve solar cell efficiency. There are different forms of solar cells, including, but not limited to, silicon solar cells and thin film solar cells. One form of thin film solar cell is referred to as CIGS, Cu(InGa)Se2, which has a high efficiency for a thin film solar cell. However, even with the current levels of efficiency provided by the CIGS, there is a need to further improve the efficiency and to reduce losses.

SUMMARY

The embodiments include a thin film solar cell having a reduced absorber layer thickness.

In one aspect, a thin film solar cell is created with a layered backside contact comprising an embossed substrate. A backside of a substrate is modified or otherwise deformed to create one or more extensions from a planar backside surface. A multi-layered substrate is formed in communication with the backside by depositing a conducting layer on the modified backside surface of the substrate, depositing a reflective layer on the conducting layer, and a passivation layer on the reflective layer. The resulting layered backside substrate is polished to form a planar backside surface. The polishing exposes portions of the conducting layer at the surface of the substrate. Thereafter, several more layers are applied to the backside contact, including an absorber layer, a buffer layer, a transparent oxide, and an anti-reflective coating. A contact grid, in communication with the transparent oxide, is then formed on the backside of the layered substrate.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments unless otherwise explicitly indicated.

DETAILED DESCRIPTION

It will be readily understood that the components of the embodiments, as generally described and illustrated in the Figures herein, may be arranged and designed in a wide variety of different configurations. Thus, the following detailed description of the embodiments of the methods and thin film solar cell of the embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Typical thin film solar cell absorber layers from CIGS, Cu(InGa)Se2, are layered stacks formed over a substrate, with a metal layer as a backside contact, an absorber layer, a buffer layer, and a transparent conductive oxide as a front contact, followed by an anti-reflective coating and a contact grid for optical and electrical performance considerations. Modifications are made to the substrate employed in the manufacture of the CIGS solar cell. More specifically, one or more protrusions are formed on the substrate and function to form a backside contact with reduced backside recombination, reduced absorption, and improved reflection in a backside reflector. Details of the modification(s) are described in detail in combination with the associated drawing figures.

Figure 1:
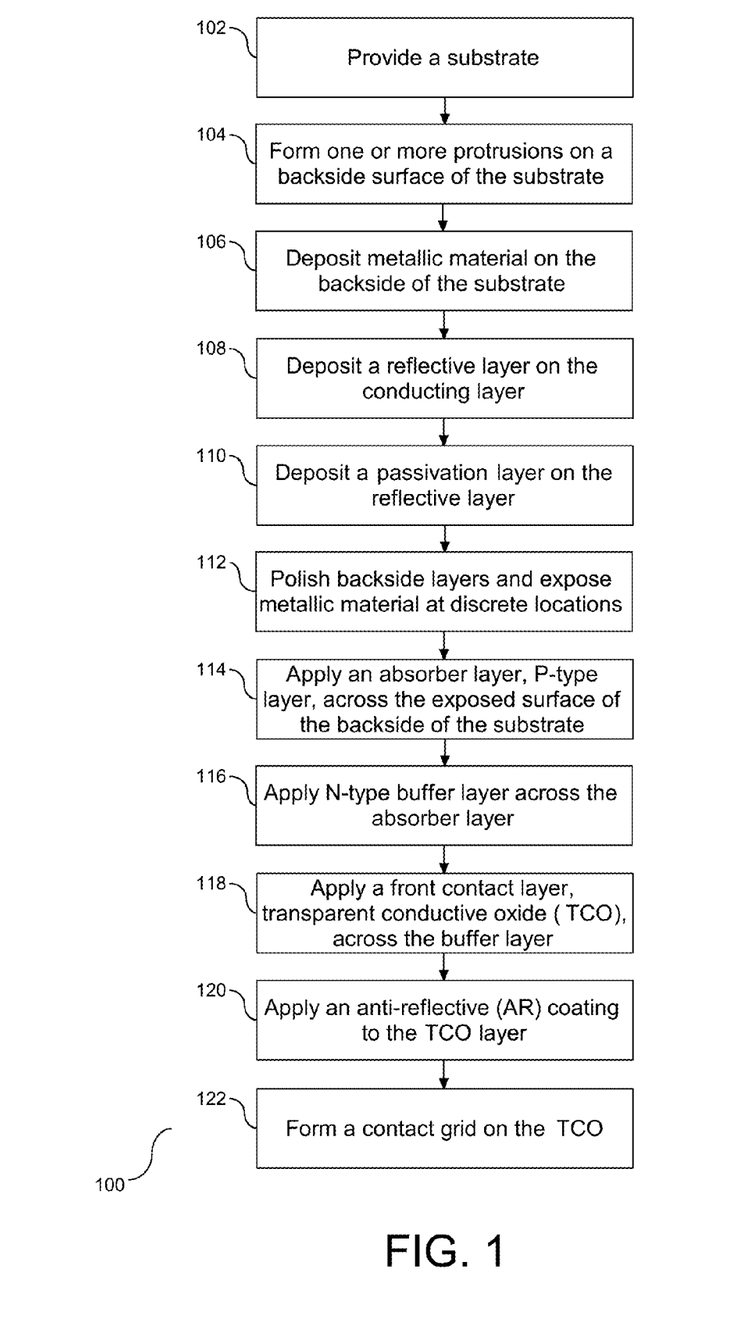
FIG. 1 depicts a flow chart illustrating a method for manufacturing a thin film solar cell backside contact.

As described herein below, a thin film solar cell backside contact is manufactured using a pre-structured substrate. The backside contact is formed to passivate the absorber layer material while maintaining sufficient electrical contact between the absorber layer and the conductive layer of the backside contact. With reference to FIG. 1, a flow chart is provided illustrating a method for manufacturing a thin film solar cell backside contact (100). A substrate is provided (102) and one or more protrusions are formed on a surface of the substrate (104). The substrate is comprised of a material that can be mechanically deformed, such as a polymer material, a metal, or glass. In one embodiment, the surface subject to the deformation is a backside of the substrate. Different processes may be employed for forming the protrusions, including but not limited to, stamping, embossing and nano-structuring. Regardless of the specific process employed, one or more protrusions are formed on a select surface of the substrate. For example, in one embodiment, a set of rollers may be employed to receive the substrate. After the protrusions are formed, a metallic material is deposited on the substrate (106) and specifically on the backside side of the substrate where the protrusions at step (104) are formed. In one embodiment, the layer of metallic material formed from the deposit at step (106) is uniform or relatively uniform across the substrate, including the protrusions and the surface(s) between a set of protrusions.

The deposit at step (106) forms a conducting layer on the embossed substrate (104) and provides ohmic contact for the solar cell. In one embodiment, the material deposited at step (106) is Molybdenum (Mo) material. In one embodiment, an alternative metallic material may be deposited at step (106). Similarly, in one embodiment, the process of depositing the material at step (106) is via sputter deposition, although this method should not be considered limiting. Following the deposit at step (106), a reflective layer is deposited on the conducting layer (108). In one embodiment, the reflective layer deposited at step (108) is comprised of silver (Ag), although this specific material should not be considered limiting. Although the reflective layer deposited at step (108) is comprised of a metallic material, the purpose of the reflective layer is to provide a greater reflection characteristic and capability than provided by the material deposited at step (106). The material deposited at step (106) functions as a conducting layer and the material deposited at step (108) functions as a reflective layer. In one embodiment, the layer of reflective material formed from the deposit at step (108) is uniform or relatively uniform across the substrate, including the protrusions and the surface(s) between a set of protrusions. Accordingly, a first side of the reflective layer is placed in physical contact with a second side, e.g. backside surface, of the conducting layer and enhanced optical reflection.

Following step (108), a passivation layer is deposited on the reflective layer (110). Specifically, a first side of a passivation layer in placed in physical contact with a second side, e.g. exposed surface, of the reflective layer. In one embodiment, the passivation layer is constructed from a dielectric, such as Aluminum Oxide ($Al_2O_3$). The function of the passivation layer is to reduce surface recombination. In one embodiment, the passivation layer formed at step (110) is uniform or relatively uniform across the substrate, including the protrusions and the surface(s) between a set of protrusions. Accordingly, the substrate formed at step (102) with one or more protrusions, is layered with conducting, reflective, and passivating materials.

As shown and described in steps (104)-(110), the layers of materials deposited on the modified backside of the substrate is uniform or relatively uniform across the surface(s), including the protrusions. More specifically, the layers themselves are uniform or relatively uniform so that the protrusions formed at step (102) remain, and the backside surface of the substrate is not planar, e.g. flat, across the entirety of its length. Following application of the passivation layer at step (110), a polishing step (112) takes place to expose the metallic material deposited at step (106). More specifically, the polishing step (112) effectively shaves off the length of the protrusions that extend from the relatively planar surface between adjacently positioned protrusions. In one embodiment, the polishing step (112) creates an external surface of the backside of the substrate with non-uniform material. On the backside, the surface area adjacent to the shaved protrusions has an exposed metallic material, e.g. Molybdenum (Mo), and the surface area extending between adjacently positioned and shaved protrusions has an exposed external surface comprised of the material deposited as the passivation layer, e.g. a dielectric, such as Aluminum Oxide ($Al_2O_3$). The polishing steps effectively forms a planar exposed external surface on the backside of the substrate, with the surface area comprised of two sets of regions, including one region having an exposed metallic material and a second region having an exposed dielectric.

Different embodiments may be employed for the polishing described at step (112), including but not limited to a mechanical polishing process, a chemical polishing process, or a combination of the processes. Regardless of the specific embodiment employed, the effect of polishing changes the surface profile of the backside of the substrate. Specifically, polishing removes material above the substrate protrusions, also referred to herein as extensions or pedestals. In one embodiment, the resulting surface profile of the backside contact is flat or relatively planar across the surface. The term relatively planar as used in the description of the method and resulting product is directed to a surface that is planar or flat, but may be subject to variations wherein the surface is not entirely planar or flat. As a result of the polishing, portions of conducting layer material and reflective layer material are exposed at the external surface of the layered substrate (112). Specifically, the surface of the backside contact comprises sections of passivation layer material and conducting layer material, with the conducting layer material exposed at discrete locations on the backside adjacent to the extensions that are present in the non-exposed layers. In one embodiment, the polishing is limited to exposing each material from the conducting layer at select areas of the exposed surface. In another embodiment, the polishing exposes a thin metal ring or stripe across the exposed surface area of the substrate having a dimension of the thickness of the conducting layer material. The amount of exposed conducting layer material may be greater than the amount of exposed passivation layer material. Accordingly, polishing the layered, embossed substrate exposes conducting material on the external surface of the substrate.

Following step (112), an absorber layer is applied across the exposed surface of the backside of the substrate (114). More specifically, a p-type layer is deposited at step (114). The p-type layer may be a semiconductor material in the form of CIGS, a material composed of copper, indium, gallium, and selenium, or in one embodiment a semiconductor material in the form of CZTS, copper zinc tin sulfide. In one embodiment, the layer of CIGS is between 0.5 and 5 micrometers in thickness. An n-type buffer layer is added (116), e.g. applied, across the p-type absorber layer applied at step (114). The layers deposited at steps (114) and (116) each provide a relatively uniform thickness across the substrate, and together with the polishing described at step (112), creates additional layers to the relatively planar characteristic of the external backside surface of the substrate.

Following step (116), a front contact layer is applied (118) across the buffer layer. The front contact layer is in the form of a transparent conductive oxide (TCO), such as, but not limited to, Indium Tin Oxide, Zinc Oxide doped with Aluminum, or a similar material. Application of the front contract layer allows light to enter the layers applied to the substrate and to be electrically conductive. In one embodiment, the TCO is applied across the buffer layer (116) and is relatively uniform in thickness across the surface area of the layers of the structure being formed. An anti-reflective (AR) coating is then applied to the TCO layer (120). The AR coating functions to facilitate entry of light to the TCO and the rest of the structure formed at steps (102)-(118). In one embodiment, the AR coating is comprised of Magnesium Fluoride ($MgF_2$), although in one embodiment an alternative material may be employed for the AR coating. Similarly, in one embodiment, application of the AR coating at step (120) results in a relatively uniform thickness of this layer across the surface area of the layers of the structure being formed. Following the application at step (120), a contact grid is formed on the TCO (122). In one embodiment, application of the contact grid at step (122) includes at least two sub-processes, including polishing the AR coating in select and discrete areas, either chemically or mechanically, so that one or more openings to the TCO layers are formed, and application of conductive material to the polished area(s). Application of the conductive material to the discrete polished areas enables the contact grid to have direct communication with the TCO. In one embodiment, the material applied at step (122) is in direct communication with the TCO. Similarly, in one embodiment, the material applied at step (122) is comprised of Nickel or Aluminum, or a material having similar properties. Application of the material at step (122) to a plurality of discrete area of the layers of the structure forms a contact grid.

Figure 2:
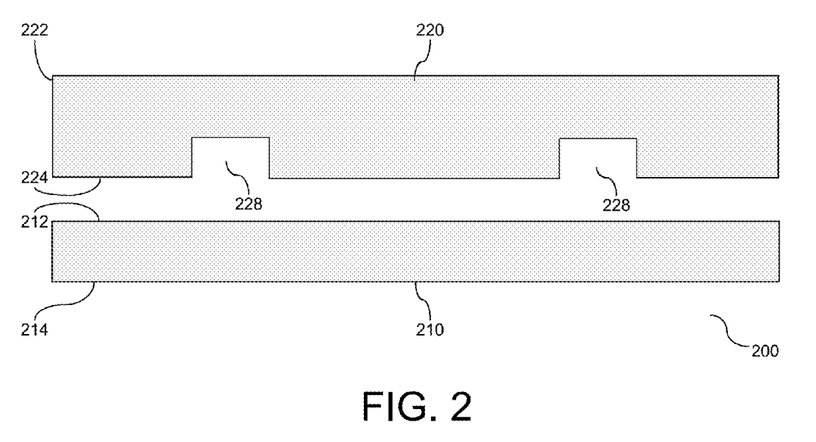
FIG. 2 depicts a block diagram of a two-dimensional representation of the substrate and an associated modification tool.

With reference to FIG. 2, a block diagram (200) of a two-dimensional representation of the substrate and an associated modified tool, such as a stamp is shown. More specifically, the substrate (210) as shown have two oppositely disposed sides, including a first side (212) and a second side (214). Both the first and second sides (212) and (214) have planar or relatively planar surfaces. As described in FIG. 1, the substrate is comprised of a material that can be mechanically deformed, such as a polymer, metal, or glass material, or a combination of materials with similar properties. A stamp (220) is shown adjacently positioned relative to the substrate (210). More specifically, the stamp (220) is provided with two oppositely disposed sides, including a first side (222) and a second side (224). In one embodiment, a surface profile of the first side (222) of the stamp (220) is planar or relatively planar. The surface profile of the second side (224) of the stamp (220) is not planar across its length. As shown, the second side (224) includes one or more indentations (228) spaced across the length of the surface. The stamp (220) is configured to make physical contact with the substrate (210) and with the indentations (228) forming protrusions in the substrate (210), as shown and described in FIG. 3. As the second side (224) of the stamp (220) makes physical contact with the first side (212) of the substrate (210), also referred to herein as the backside, the stamp (220) embosses the substrate (210) with the surface profile of the second side (224) of the stamp (220). The embossing results in forming an uneven surface area, e.g. relatively non-planar, on the backside (212) of the substrate (210). In one embodiment, the formed surface profile of the substrate is equal and opposite to the surface profile of the second side (224) of the stamp (220). Accordingly, a physical profile of the substrate is modified from a planar or relatively planar first side (212) to a non-planar or relatively non-planar backside (212).

As shown and described in FIG. 2, the physical structure of the substrate is modified without changing the chemical structure of the substrate. More specifically, the physical profile of the substrate is modified to create a non-planar surface area on the backside surface. The embodiment shown and described herein demonstrates a stamping process for the modification. In one embodiment, an alternative process may be employed with the same or similar results. An example of the alternative process is placing the substrate through a set of rollers, with one roller having a flat or relatively flat exterior surface and a second roller with one or more spikes or stems. As the rollers move over the surfaces of the substrate, the surface of the substrate adjacent to the planar roller surface remains unchanged and the surface of the substrate adjacent to the roller with the one or more spikes or stems is modified, and more specifically, indentations are formed on the surface of the substrate in communication with the spike(s) or stem(s). Accordingly, a non-planar surface of the substrate may be created through an alternative mechanical deformation process.

Figure 3:
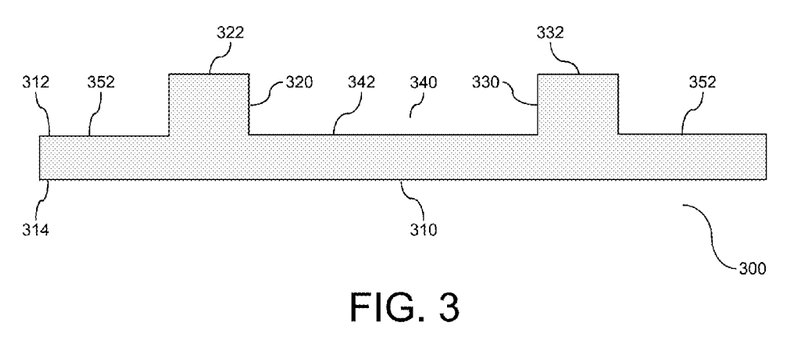
FIG. 3 depicts a block diagram illustrating a two-dimensional profile of a modified substrate.

With reference to FIG. 3, a block diagram (300) is provided illustrating a two-dimensional profile of a modified substrate. More specifically, the modified substrate (310) is shown comprising a first side (312) and a second side (314). The first side (312) is also referred to herein as the backside of the substrate. In the example shown herein, two extensions, also referred to herein as protrusions and pedestals, are shown, including a first extension (320) and a second extension (330). In one embodiment, additional extensions may be formed. As such, the quantity of extensions shown and described herein should not be considered limiting. Each extension (320) and (330) is formed through the structuring process, as shown and described in FIGS. 1 and 2. Planar, or relatively planar, surfaces (322) and (332) are created in association with the extensions (320) and (330), respectively. A space (340) is provided along the first side (312), with a surface of the substrate (342) extending between the extensions (320) and (330) being planar or relatively planar with surface (352). Two relatively planar and parallel surfaces are provided, including surfaces (342) and (352) representing a first planar or relatively planar surface, and surfaces (322) and (332) representing a second planar surface, with surfaces (322) and (332) being the first surface of each of the extensions (320) and (330), respectively, and surfaces (342) and (352) being the backside surface of the substrate. In one embodiment, the first extension (320) and second protrusion (330) reflect an equal and opposite surface profile of a stamp or modified roller profile used to emboss the substrate (310). Similarly, in one embodiment, surfaces (342) and (352) are co-planar, and surfaces (322) and (332) are co-planar. Accordingly, the backside of the substrate comprises a surface profile with at least two separate planar surfaces.

Figure 4:
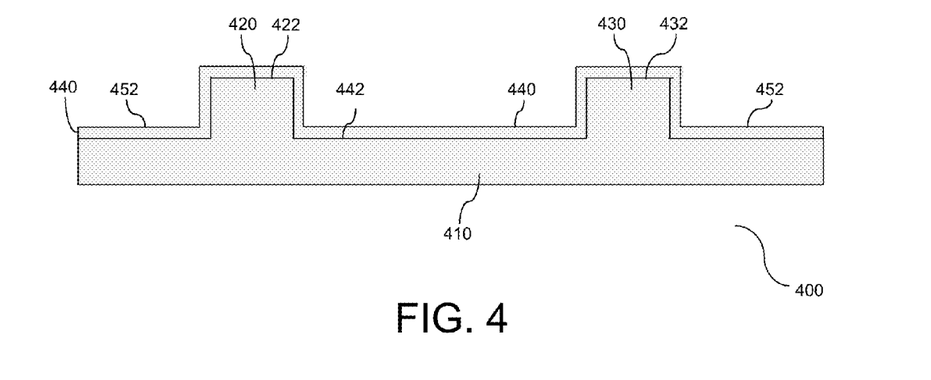
FIG. 4 depicts a block diagram illustrating a two-dimensional profile of a modified substrate with an applied metallic layer.

With reference to FIG. 4, a block diagram (400) is provided illustrating a two-dimensional profile of a modified substrate with an applied metallic layer. As shown, the modified substrate includes two separate and distinct materials. The first layer (410) is the substrate itself, as shown and described in FIG. 2, including the associated extensions (420) and (430). A layer of metallic material (440) is applied across the exposed surfaces of the backside of the substrate (410), including the planar surface(s) (442) and (452) adjacent to the backside of the substrate, and the planar surfaces (422) and (432) of the extensions (420) and (430), respectively. In one embodiment, the metallic material (440) is comprised of Molybdenum (Mo). As shown, the layer of metallic material (440) is applied uniformly or substantially uniformly across the exposed surfaces of the substrate.

Figure 5:
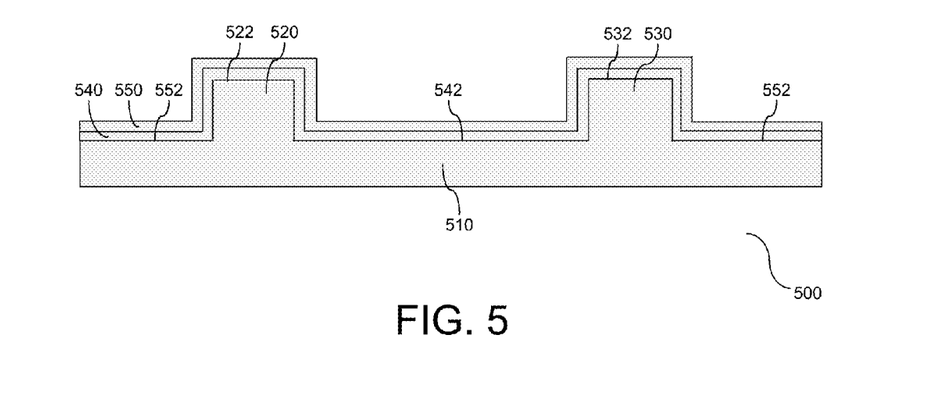
FIG. 5 depicts a block diagram illustrating a two-dimensional profile of a modified substrate with the applied metallic layer, as shown in FIG. 4, and a deposited reflector.

Referring to FIG. 5, a block diagram (500) is provided illustrating a two-dimensional profile of a modified substrate with the applied metallic layer, as shown in FIG. 4, and a deposited reflector. As shown, the modified substrate includes three separate and distinct materials. The first layer (510) is the substrate itself, as shown and described in FIG. 2, including the associated extensions (520) and (530), and a layer of metallic material (540) is applied across the exposed surfaces of the backside of the substrate, as shown and described in FIG. 4. The second layer (550) referred to herein as a reflector, is in one embodiment also referred to as a second metallic layer to enhance the reflective properties of the first metallic layer (540). In one embodiment, the reflector is comprised of Silver. The reflector (550) is applied across the layers of the backside of the modified substrate shown and described in FIG. 4, including the layers adjacent to planar surface(s) (542) and (552), and the planar surfaces (522) and (532) of the extensions (520) and (530), respectively. As shown, the second layer of metallic material (550) is applied uniformly or substantially uniformly across the exposed surfaces of the backside of the substrate.

Figure 6:
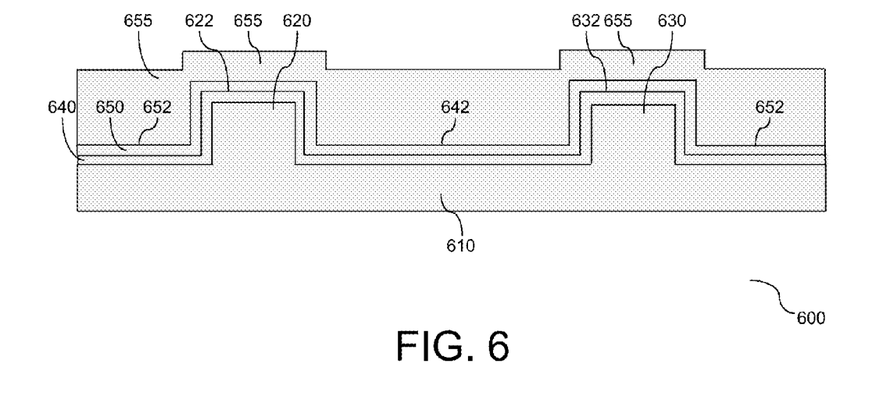
FIG. 6 depicts a block diagram illustrating a two-dimensional profile of a modified substrate with the applied reflector, as shown in FIG. 5, and a deposited passivation layer.

Referring to FIG. 6, a block diagram (600) is provided illustrating a two-dimensional profile of a modified substrate with the applied reflector, as shown in FIG. 5, and a deposited passivation layer. As shown, the modified substrate includes four separate and distinct materials. The first layer (610) is the substrate itself, as shown and described in FIG. 2, includes the associated extensions (620) and (630), the layer of metallic material (640) applied across the exposed surfaces of the backside of the substrate, as shown and described in FIG. 4, and the second layer, also referred to as the reflector (650), applied across the metallic material (640). A passivation layer (655) is shown herein applied to and in physical contact with the reflective layer (650). Specifically, the passivation layer (655) is applied across the exposed layers of the backside of the modified substrate shown and described in FIG. 5, including the exposed planar surface(s) (642) and (652), and the planar surfaces (622) and (632) of the extensions (620) and (630), respectively. In one embodiment, the passivation layer (655) is comprised of Aluminum Oxide ($Al_2O_3$), although this material should not be considered limiting, and in one embodiment, an alternate material may be employed for the passivation layer. As shown, the passivation layer (655) is applied uniformly or substantially uniformly across the exposed surfaces of the substrate. Accordingly, the substrate of FIG. 2 is shown herein as a layered object across the backside of the substrate with an exposed passivation material.

Figure 7:
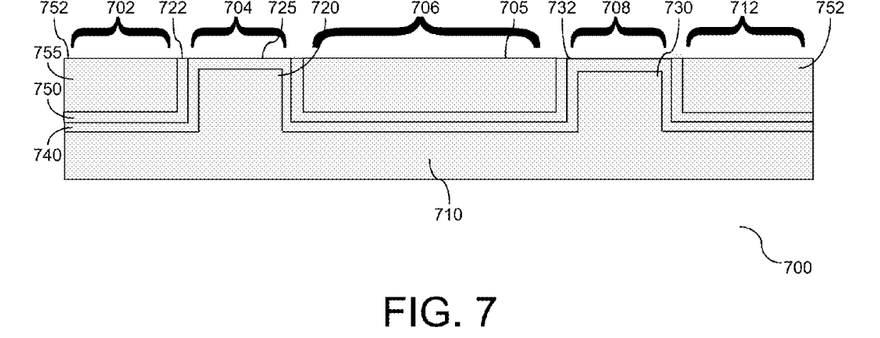
FIG. 7 depicts a block diagram illustrating a two-dimensional profile of a modified substrate with the applied passivation layer, as shown in FIG. 6, and with a surface area of the extensions exposed.

With reference to FIG. 7, a block diagram (700) is provided illustrating a two-dimensional profile of a modified substrate with the applied passivation layer, as shown in FIG. 6, and with a surface area of the extensions exposed. The process of exposing the extensions is described in detail in FIG. 1. As shown herein, the modified backside of the substrate includes four separate and distinct materials, as shown and described in FIG. 6, including the first layer (710) being the substrate itself, as shown and described in FIG. 2, with the associated extensions (720) and (730), the layer of metallic material (740) applied across the exposed surfaces of the substrate, as shown and described in FIG. 4, and the second layer, also referred to as the reflector (750), applied across the metallic material (740). In addition, the passivation layer (755) is shown herein applied to and in physical contact with the reflective layer (750). Extensions (720) and (730) are subject to polishing. Specifically, the extensions (720) and (730) are vertically reduced, e.g. shaved, via a polishing technique until the vertical position of the extensions is planar with the surfaces (742) and (752). Once the polishing process is completed, the exposed surface of the modified backside of the substrate comprises a flat surface profile, with no extensions remaining on the backside. The polished second side (705) exposes the metallic material (740), as shown in FIG. 4. More specifically, exposure of the metallic material (740) is limited to the surface area of the second side at (725) and (732) adjacent to the extensions (720) and (730), respectively. A top view of the modified substrate of FIG. 7 following the polishing process would separate the surface area of the backside of the substrate into five sections, including a first section (702), a second section (704), a third section (706), fourth section (708), and a fifth section (712). The exposed surface of the second and fourth sections (704) and (708), respectively, are comprised of the metallic material applied and shown in FIG. 4. In contrast, the exposed surface of the first, third, and fifth sections (702), (706), and (712), respectively, are comprised of the material of the passivation layer, as shown and described in FIG. 6. Accordingly, the polishing of the modified backside of the substrate exposes the metallic material of the first applied layer on select areas of the modified substrate.

Figure 8:
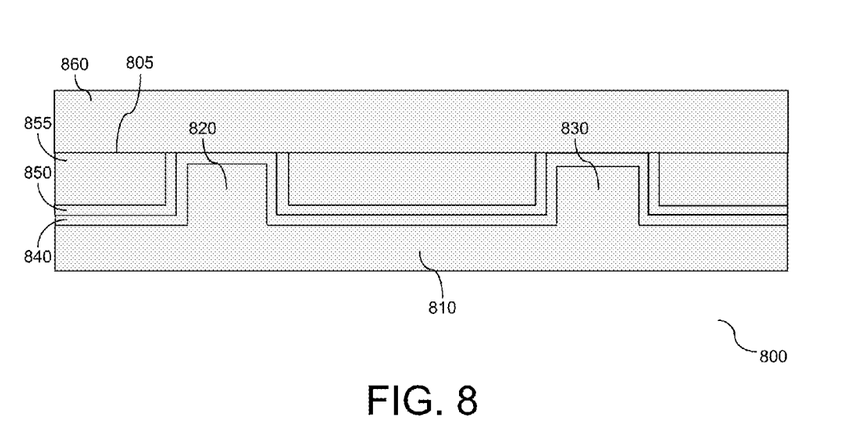
FIG. 8 depicts a block diagram illustrating a two-dimensional profile of a modified substrate with the applied passivation layer subject to polishing at select portions of the exposed surface area, as shown in FIG. 7.

With reference to FIG. 8, a block diagram (800) is provided illustrating a two-dimensional profile of a modified substrate with the applied passivation layer subject to polishing at select portions of the exposed surface area, as shown in FIG. 7. Following the polishing step, the exposed surface (805) is planar or relatively planar. As shown herein, the modified substrate includes four separate and distinct materials, as shown and described in FIG. 7, including the first layer (810) being the substrate itself, as shown and described in FIG. 2, with the associated extensions non-existent from a top view of the exposed surface, e.g. backside of the substrate, (805). In one embodiment, the extensions (820) and (830) are only visible within the internal configuration of the layers of the modified substrate. A layer of metallic material (840) is applied across the surfaces of the substrate, as shown and described in FIG. 4, and the second layer, also referred to as the reflector (850) is applied across the metallic material (840). In addition, the passivation layer (855) is shown herein applied to and in physical contact with the reflective layer (850), with the surface area of the extensions polished and planar with the material of the passivation layers. As shown herein, an absorber material (860) is applied across the exposed surface of the passivation layer (855), including the metallic material, Molybdenum. In one embodiment, the absorber material is deposited and layer (860) is formed comprised of CIGS or CZTS. Details of these materials are shown and described in the flow chart of FIG. 1. Accordingly, application of the absorber material (860) creates an exposed backside surface having a uniform material.

Figure 9:
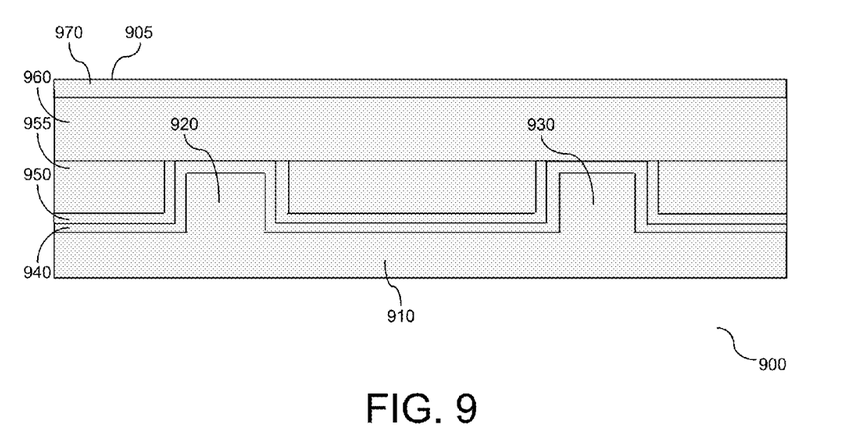
FIG. 9 depicts a block diagram illustrating a two-dimensional profile of a modified substrate with the applied absorber.

With reference to FIG. 9, a block diagram (900) is provided illustrating a two-dimensional profile of a modified substrate with the applied absorber, as shown in FIG. 8. More specifically, the layers of the modified substrate shown herein include the first layer (910) being the substrate itself, as shown and described in FIG. 2, with the associated extensions non-existent from a top view of the exposed backside surface (905) shown with the applied layers of materials. In one embodiment, the extensions (920) and (930) are only visible within the internal configuration of the layers of the modified substrate. A layer of metallic material (940) applied across the surfaces of the substrate, as shown and described in FIG. 4, and the second layer, also referred to as the reflector (950) is applied across the metallic material (940). In addition, the passivation layer (955) is shown herein applied to and in physical contact with the reflective layer (950), with the surface area of the extensions polished and planar with the material of the passivation layers. The absorber material (960), also referred to herein as an absorber layer, is applied across the exposed surface of the passivation layer (955), including the metallic material, Molybdenum, of the area adjacent to the extensions. In addition, a buffer layer (970) is deposited across the top surface of the absorber material (960). In one embodiment, the material of the buffer layer is planar or relatively planar across the exposed surface(s) of the modified substrate. Details of the materials of the buffer layer are shown and described in the flow chart of FIG. 1.

Figure 10:
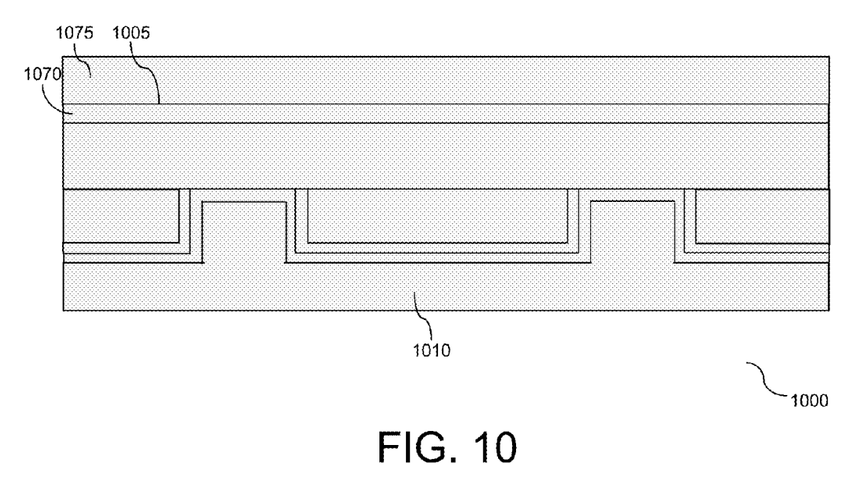
FIG. 10 depicts a block diagram illustrating a two-dimensional profile of a modified substrate with a transparent coating oxide applied to the buffer layer.

With reference to FIG. 10, a block diagram (1000) is provided illustrating a two-dimensional profile of the modified substrate with a transparent oxide coating applied to the buffer layer. The structure of the modified substrate of FIG. 9 is incorporate herein with like numbers have the same suffix. As shown herein, a transparent conductive oxide material (1075) is applied across the exposed surface(s) of the buffer layer (1070), as shown and described in FIG. 9. Details of the materials of the transparent conductive oxide are shown and described in the flow chart of FIG. 1. Application of the transparent conductive oxide material (1075) is uniform or relatively uniform across the exposed surface(s) (1005) of the modified backside of the substrate (1010). Application of the transparent conductive oxide material (1075) enables light to enter the modified substrate and to be electrically conductive.

Figure 11:
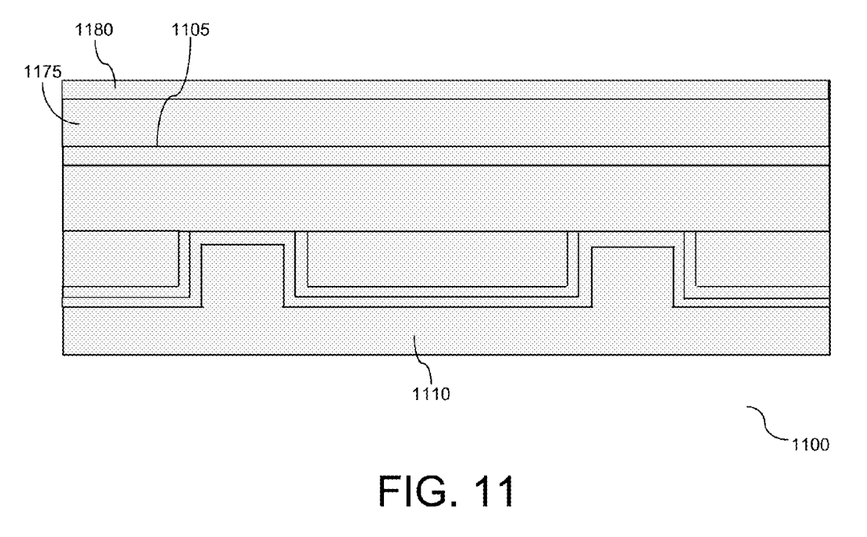
FIG. 11 depicts a block diagram illustrating a two-dimensional profile of a modified substrate with an anti-reflective coating oxide applied to the transparent conductive oxide material.

With reference to FIG. 11, a block diagram (1100) is provided illustrating a two-dimensional profile of the modified substrate with an anti-reflective coating oxide applied to the transparent conductive oxide material. The structure of the modified substrate of FIG. 10 is incorporate herein with like numbers have the same suffix. As shown herein, an anti-reflective coating (1180) is applied across the exposed backside surface(s) of the transparent conductive oxide material (1175), as shown and described in FIG. 9. Details of the materials of the anti-reflective coating are shown and described in the flow chart of FIG. 1. In one embodiment, the material of the coating (1180) may include Magnesium Fluoride, $MgF_2$, or a material having similar properties. Application of the anti-reflective coating (1180) is uniform or relatively uniform across the exposed surface(s) (1105) of the backside of the modified substrate. Application of the transparent conductive oxide (1075) enables delivery of light to the transparent conductive oxide material and the other layers of the modified substrate (1110).

Figure 12:
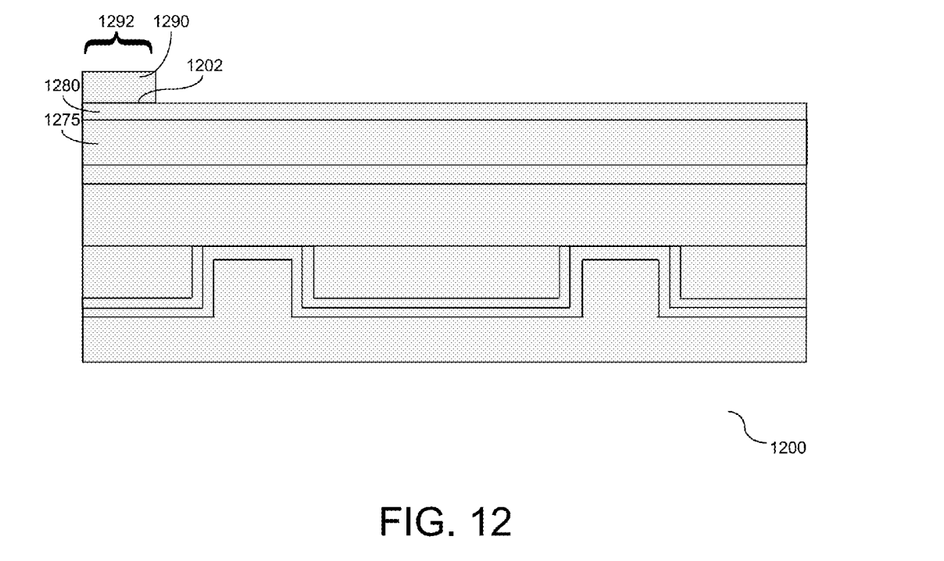
FIG. 12 depicts a block diagram illustrating a two-dimensional profile of a modified substrate with a contact grid in the form of a conductive material applied to select areas of the exposed surface(s) of the modified and layered substrate.

With reference to FIG. 12, a block diagram (1200) is provided illustrating a two-dimensional profile of a modified substrate with a contact grid in the form of a conductive material applied to select areas of the exposed surface(s), e.g. backside, of the modified and layered substrate. The structure of the modified substrate of FIG. 11 is incorporate herein with like numbers have the same suffix. As shown herein, the external surface area of the modified substrate is comprised of an anti-reflective coating (1280) applied uniformly or relatively uniform across the exposed surface. One or more select areas of the anti-reflective coating are shown polished so that the material of the transparent conductive oxide layer (1275) are exposed. The polishing process may take place mechanically or chemically. In the example shown herein, one select area (1292) is shown, with a contact grid (1290) placed on the polished area. As shown, the vertical surface area of the contact grid (1290) extends from the exposed surface (1202) of the anti-reflective coating layer. In one embodiment, the contact grid (1290) is comprised of Nickel or Aluminum. Multiple contacts, such as that shown and described at (1290) form a contact grid, with each contact in physical communication with the transparent conductive oxide layer (1275) due to the conductivity of the material.

The layers of the modified substrate, and specifically the layers as applied to the backside of the substrate, as shown and described in FIGS. 2-12, includes a substrate with elevated points of contacts, referred to herein as extensions. The polishing step of the extensions causes the exposed surfaces of the extensions to be planar with the surfaces of the backside that are between the extensions, so that metallic material of the extension areas is exposed to provide contact to the absorber material.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed.

Many modifications and variations will be apparent to those of ordinary skill in the art without departing from the scope and spirit of the embodiments. The embodiments have been chosen and described in order to best explain the principles of the embodiments and the practical application, and to enable others of ordinary skill in the art to understand the various embodiments with various modifications as are suited to the particular use contemplated. Accordingly, the implementation of the extensions in the formation of the layered substrate reduces backside recombination, reduces absorption, and improves reflection in the backside reflector.

It will be appreciated that, although specific embodiments have been described herein for purposes of illustration, various modifications may be made without departing from the spirit and scope. In particular, formation and function of the extensions in the layered substrate can be used to provide nano-sized contacts. Accordingly, the scope of protection of the embodiments is limited only by the following claims and their equivalents.

What is claimed is:

1. A thin film solar cell, the cell comprising:
   a layered, backside contact comprising an embossed substrate, a conducting layer, a reflective layer, and a passivation layer, the contact polished to expose portions of the conducting layer at the surface of the contact;
   an absorber layer in communication with the contact;
   a buffer layer in communication with the absorber layer;
   a transparent layer in communication with the buffer layer;
   a contact grid in communication with the transparent layer; and
   an anti-reflective coating in communication with the contact grid and the transparent layer.

2. The cell of claim 1, wherein the conducting layer is constructed from a Molybdenum (Mo) material.

3. The cell of claim 1, wherein the reflective layer is constructed from a silver (Ag) material.

4. The cell of claim 1, wherein the passivation layer is constructed from an Aluminum Oxide ($Al_2O_3$) material.

5. The cell of claim 1, wherein the absorber layer is constructed from a material selected from the group consisting of: Copper Indium Gallium Selenide (CIGS) and copper zinc tin sulfide (CZTS).

6. The cell of claim 5, wherein the layer of CIGS is between 0.5 and 5 micrometers in thickness.

* * * * *